United States Patent [19]
Pelletier et al.

[11] Patent Number: 5,536,914
[45] Date of Patent: Jul. 16, 1996

[54] DEVICE FOR EXCITING A PLASMA TO ELECTRON CYCLOTRON RESONANCE BY MEANS OF A WIRE APPLICATOR OF A STATIC MAGNETIC FIELD AND OF A MICROWAVE FIELD

[75] Inventors: Jacques Pelletier, Saint Martin D'Heres; Antoine Durandet, Paris, both of France

[73] Assignee: Metal Process (Societe a Responsabilite Limitee), Montevrain, France

[21] Appl. No.: 202,026

[22] Filed: Feb. 25, 1994

[30] Foreign Application Priority Data

Feb. 25, 1993 [FR] France ................................. 93 02414

[51] Int. Cl.$^6$ ................................................. B23K 10/00
[52] U.S. Cl. ........................ 219/121.48; 219/121.43; 219/121.52; 219/748; 204/298.19; 204/298.37
[58] Field of Search .................... 219/121.43, 121.44, 219/121.4, 121.52, 121.48, 748; 156/643, 646, 345; 204/298.37, 298.38, 298.16, 298.19

[56] References Cited

U.S. PATENT DOCUMENTS

| | | |
|---|---|---|
| 4,745,337 | 5/1988 | Pichot et al. . |
| 5,216,329 | 6/1993 | Pelleteir . |
| 5,227,695 | 7/1993 | Pelletier et al. . |
| 5,234,565 | 8/1993 | Yoshida ............................ 204/298.38 |
| 5,311,103 | 5/1994 | Asmussen et al. ................ 315/111.81 |
| 5,370,765 | 12/1994 | Dandl ................................... 156/643 |

FOREIGN PATENT DOCUMENTS

| | | |
|---|---|---|
| 0109808 | 5/1984 | European Pat. Off. . |
| 0391156 | 10/1990 | European Pat. Off. . |
| 0411317 | 2/1991 | European Pat. Off. . |
| 2583250 | 12/1986 | France . |
| 61-39521 | 2/1986 | Japan . |

*Primary Examiner*—Mark H. Paschall
*Attorney, Agent, or Firm*—Bacon & Thomas

[57] ABSTRACT

The invention relates to a plasma excitation device comprising at least one electrically conductive wire applicator fed form an energy source in the microwave range and means for creating a magnetic field and adapted to create at least one surface having a constant magnetic field of a flux density that corresponds to electron cyclotron resonance. According to the invention, the wire applicator includes the means for creating the magnetic field, with the main component thereof being situated in a cross-section of the applicator and extending over at least a fraction of the length of the applicator, said applicator thus constituting an applicator both of a microwave electric field and of a static magnetic field.

12 Claims, 2 Drawing Sheets

DEVICE FOR EXCITING A PLASMA TO ELECTRON CYCLOTRON RESONANCE BY MEANS OF A WIRE APPLICATOR OF A STATIC MAGNETIC FIELD AND OF A MICROWAVE FIELD

The present invention relates to the general technical field of producing a low pressure plasma excited by microwave energy in the field of electron cyclotron resonance.

BACKGROUND OF THE INVENTION

The present invention relates to a wide variety of applications, such as producing ion beams obtained by extracting the plasma, or surface treatments such as etching, deposition, chemical or thermochemical treatment, spraying, cleaning, disinfection, or decontamination.

In the technical field of exiting a plasma to electron cyclotron resonance, resonance is obtained when the gyration frequency of an electron in a magnetic field that is static or quasi-static is equal to the frequency of the applied accelerating electric field. Such resonance is obtained for a magnetic field B and an excitation frequency f that are related by the equation:

$$B = 2\pi m f/e$$

where m and e are the mass and the charge of an electron.

When exiting a plasma, electron cyclotron resonance is effective only if the electron is accelerated sufficiently, i.e. if the electron can rotate for sufficient time in phase with the electric field to acquire the threshold energy required for ionizing the gas. To satisfy this condition, it is necessary firstly for the radius of gyration of the electron to be small enough, and in particular for it to remain in the three-dimensional region that combines the conditions required for resonance, i.e. the simultaneous presence of the electric field and of the magnetic field, and secondly for the gyration frequency f to be large compared with the frequency with which electrons collide with neutral bodies such as atoms and/or molecules. In other words, the best conditions for exciting a plasma to electron cyclotron resonance are obtained when gas pressure is relatively low and simultaneously electric field frequency f is high, i.e. for a magnetic field magnitude B that is high. In practice, in a conventional plasma, conditions favorable to excitation to electron cyclotron resonance are obtained for frequencies f of the order of or greater than 500 MHz and gas pressures of the order of 0.1 Pascals, or from $10^{-3}$ to a few tens of Pascals depending on the nature of the gas and on the excitation frequency. However, microwave frequencies above 10 GHz require very high magnetic flux densities that would appear not to be within reach of present day permanent magnets and simple magnetic structures. At a frequency f equal to 2.45 GHz, the flux density B is 0.0875 Teslas, and it exceeds 0.35 Teslas at 10 GHz.

French patent No. 85 08 836 describes a technique for exciting a plasma to electron cyclotron resonance that requires permanent magnets to be used, each of which creates at least one surface at constant magnetic field and of magnitude corresponding to electron cyclotron resonance. The microwave energy is conveyed to the resonance zone via plasma exciters or antennas each constituted by a metal wire element. Each exciter extends close to and along a magnet, being disposed over a permanent magnet.

The magnetic field of magnitude equal to the value that gives rise to resonance and the microwave electric field are both localized and confined essentially in the space situated between an exciter and the portion of the enclosure wall placed facing a magnet. In the presence of a gaseous medium at low pressure, electrons are accelerated in the resonance zone and they wind around the magnetic field lines that define a plasma-confinement surface. These field lines are in the form of festoons connecting the pole of a magnet to the opposite pole thereof or to the opposite pole of a consecutive magnet. Along its path, the electron dissociates and ionizes the molecules and atoms with which it collides. The plasma formed in this way in the magnetic field festoons subsequently diffuses from the field lines to form a plasma that is practically free of energetic electrons which remain trapped in the festoons.

The major drawback of the prior art described by that patent lies in the fact that the propagation zone of the microwave energy and the resonance zone where the microwave energy is absorbed are superposed. Microwave propagation can therefore take place only with losses, and the magnitude of the microwave electric field and the density of the plasma both decrease progressively along the exciter away from the microwave source. The plasma obtained has non-uniform density along the exciter, so that such a plasma appears to be unsuitable for most industrial applications.

To remedy the drawbacks mentioned above, French patent application No. 91 00 894 proposes placing the applicator in an inter-magnet zone lying between the wall of the reaction enclosure and the magnetic field lines corresponding to electron cyclotron resonance and interconnecting two adjacent poles of opposite polarity. This zone is particularly suitable for propagating microwave energy since it is practically free of plasma. This advantage results from the fact that plasma diffusion normal to the magnetic field lines is considerably reduced when the magnitude of the static magnetic field increases.

Nevertheless, that technique suffers from a drawback since the zones where the microwave electric field is at a maximum and the electron cyclotron resonance zones where the electric field magnitude matches B do not coincide. To produce excitation of the plasma, it is necessary either to increase the magnitude of the microwave electric field, or else to increase the magnitude of the magnetic field to enlarge the resonance zone. If such conditions are satisfied, a dense and uniform plasma can be produced all along the exciter.

In addition to the drawbacks specific to the two techniques described above, mention should also be made of defects which they have in common, relating to the low volume percentage of useful magnetic field produced by the permanent magnets and to the need to place antennas in a position that is accurate relative to the magnetic circuit. It should also be observed that the presence of permanent magnets covering the outside walls of the reactor makes it difficult to install systems for cooling the walls and makes access to the reaction enclosure difficult.

OBJECT AND SUMMARY OF THE INVENTION

The present invention seeks to remedy the various drawbacks mentioned above by proposing a plasma excitation device that seeks to obtain maximum magnitude at the surface of the applicator of the static magnetic and of the microwave electric field, in order to obtain maximum coupling while ensuring propagation and distribution of microwave energy along the applicator with minimum losses.

To achieve this object, the plasma excitation device comprises at least one electrically conductive wire applicator fed by a source of energy in the microwave range; and means for creating a magnetic field and adapted to create at least one surface having a constant magnetic field of a flux density that corresponds to electron cyclotron resonance, said surface extending over at least a fraction of the length of the applicator.

According to the invention, the wire applicator includes the means for creating the magnetic field, with the main component thereof being situated in a cross-section of the applicator and extending along at least a fraction of the length of the applicator, the applicator thus constituting an applicator both of a microwave electric field and of a static magnetic field.

BRIEF DESCRIPTION OF THE DRAWINGS

Various other characteristics appear from the following description made with reference to the accompanying drawings which show embodiments and implementations of the invention by way of non-limiting example.

MORE DETAILED DESCRIPTION

Figure 1:
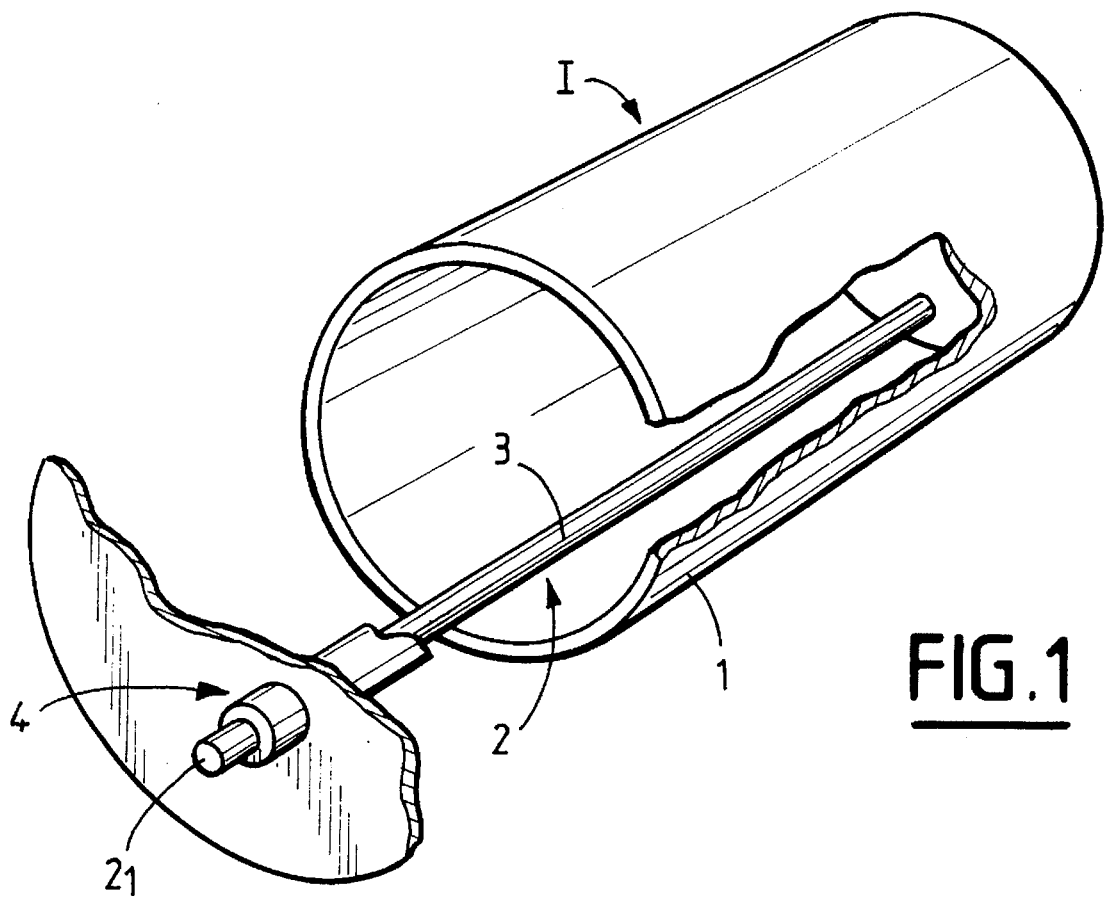
FIG. 1 is a partially cutaway diagrammatic perspective view of a plasma excitation device of the invention placed inside a reaction chamber.

By way of example, FIG. 1 shows a device I for producing a plasma from a gaseous medium of any kind, for use in a very wide variety of applications, such as surface treatments or the production of ion beams. The device comprises a sealed enclosure 1 conventionally fitted with devices for injecting gas and for pumping gas (not shown but known per se) enabling the pressure of the gas that is to be ionized to be maintained at a desired value which, for example, may be of the order of $10^{-3}$ Pascals to a few tens of Pascals, depending on the nature of the gas and on the excitation frequency. The plasma production device I also includes a device 2 of the invention for exciting the plasma to electron cyclotron resonance.

Figure 2:
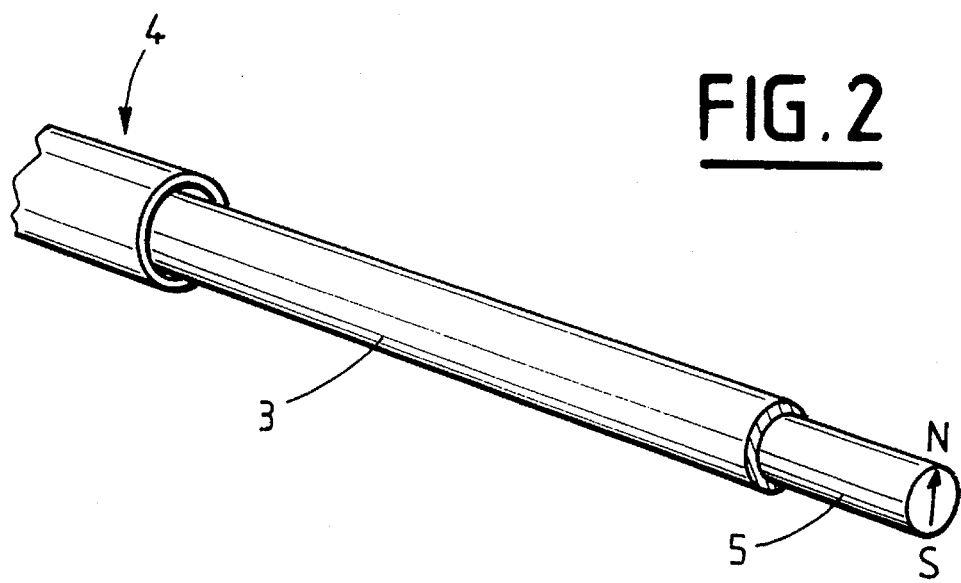
FIG. 2 is a perspective view on a larger scale of an excitation device of the invention.

The excitation device 2 of the invention includes at least one applicator 3 made of a material that conducts electrical energy well, e.g. a metal. The applicator 3 is in the form of a wire, i.e. it is elongate. The wire applicator 3 has one of its ends connected via any suitable means, e.g. a coaxial structure, to a source of energy in the microwave range. In the example shown in FIGS. 1 and 2, the wire applicator 3 extends the central core $2_1$ of a coaxial cable 4. More generally, a single coaxial structure can feed two opposed applicators or a plurality of applicators in a star configuration.

The excitation device 2 also includes means 5 for creating a magnetic field, and adapted to create over at least a fraction of the length of the applicator 3 at least one surface of constant magnetic field having magnitude corresponding to electron cyclotron resonance. According to the invention, the wire applicator 3 includes static magnetic field creating means 5 such that the applicator 3 serves locally to apply both the microwave electric field and the static magnetic field. The magnetic field creation means 5 thus form an integral portion of or are incorporated directly in the wire applicator 3. The means 5 create a static magnetic field as required for obtaining resonance conditions over at least a portion of the length of the applicator, and preferably over its entire length.

The means 5 are preferably designed to create a magnetic field that is uniform in nature all around the applicator so as to avoid too many impedance jumps for microwaves when in the presence of the plasma. The main component of the magnetic field is thus situated in this way in a cross-section of the applicator over part or all of the length of the applicator defined by the zone of application of the magnetic field. In sofar as the main component of the magnetic field remains in a cross section of the applicator, it follows necessarily that the magnetic field along the applicator is uniform.

According to the invention, the static magnetic field and the microwave electric field are both of maximum intensity at the surface of the applicator. The microwave electric field propagates between the applicator and the nearest ground plane, i.e. the wall of the enclosure 1 or the plasma itself when excited. Propagation of the wave along the applicator takes place favorably in magnetic field zones close to the applicator that are free of plasma and outside the electron cyclotron resonance zone. Such a device makes it possible to localize the microwave power in the near environment of the applicator, thereby obtaining the advantage of avoiding spreading the microwaves throughout the volume of the enclosure 1.

In one embodiment, the means 5 may be implemented by a direct electrical current passing along the wire applicator 3 and of a magnitude selected to create the static magnetic field required for obtaining resonance conditions along the applicator. This electrical current may run along the wire applicator itself, or it may run along a conductor or a superconductor mounted inside the applicator. In this example, it should be observed that the magnetic field component lies inside the right cross-section of the applicator.

In a preferred embodiment, the means 5 for creating the magnetic field are constituted by at least one permanent magnet. In the variant embodiment shown more particularly in FIG. 2, the wire applicator 3 is constituted by a tube having a cylindrical magnet mounted inside it (with or without clearance), the magnet being magnetized perpendicularly to its axis, thus having a north pole and a south pole that are diametrically opposite. Naturally, the applicator 3 may have a plurality of permanent magnets of various sections (e.g. hexagonal, square, or rectangular) incorporated therein. On the same lines, the applicator 3 may have a right cross-section of arbitrary shape. In addition, the wire applicator 3 may be made as a metal deposit of low resistivity covering the outside surface of the magnet. When the means 5 are constituted by a magnet, it should be observed that the magnets are mounted inside the applicator such that the main component of the magnetic field is preferably situated inside the right cross-section of the applicator, but that it could also be situated in a cross-section that is angularly offset relative to the right cross-section.

Figure 3:
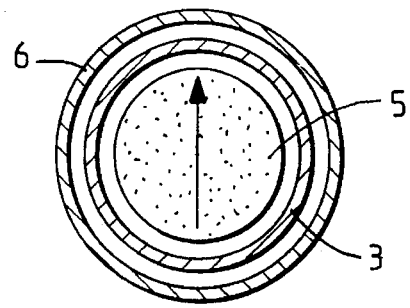
FIGS. 3 and 4 are right cross-sections showing two variant embodiments of the excitation device of the invention.

As can be seen more clearly in FIG. 3, it may be advantageous to surround the applicator 3 by means of a dielectric envelope 6 in order to obtain electrical or thermal insulation of the device relative to the outside or to avoid risks of metal contamination, or to ensure better propagation without loss of microwave energy along the applicator in the presence of plasma. The dielectric envelope 6 may be in the form of a dielectric layer deposited directly on the wire applicator, i.e. on the tube 3, or else on the metal deposit covering the magnet. As shown in FIG. 3, the dielectric envelope 6 may also be constituted by a tube that surrounds the wire applicator 3, optionally at a distance therefrom.

Figure 4:
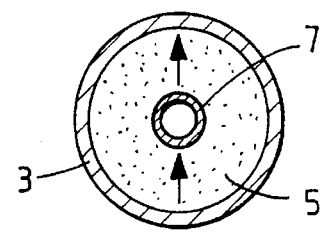

FIG. 4 shows an excitation device of the invention including at least one pipe 7 for conveying a fluid for cooling the applicator 3. The cooling pipe 7 is disposed either between the magnet 5 and the applicator 3, or else inside the magnet as shown in the figure. When go and return pipes are used, one of the pipes may be mounted inside the magnet while the other pipe is placed between the magnet and the applicator.

The wire applicator of the invention thus constitutes a self-contained excitation device suitable for being used in applications that require a single applicator. More generally, it is possible to use a plurality of applicators of this type in association, e.g. in a multipolar type structure. Multipolar type plasma sources having electron cyclotron resonance may thus be designed of geometries, dimensions, and shapes that are highly varied as a function of the number and disposition of the self-contained applicators. In the examples shown in FIGS. 5 to 7, the applicators are disposed to define a multipolar configuration of the plane kind. By way of example, the magnets 5 associated with the applicators 3 may either be disposed so that their polarities alternate in opposite directions so as to close the magnetic field from one device to the next (FIGS. 5 and 6), or else they may be oriented in arbitrary directions, such that the magnetic field of each device is independent. In some applications, microwave energy may be fed to every other applicator, for example, or applicators 3 may be used each having no means 5 for creating a static magnetic field, but nevertheless fed with microwave energy.

Figure 5:
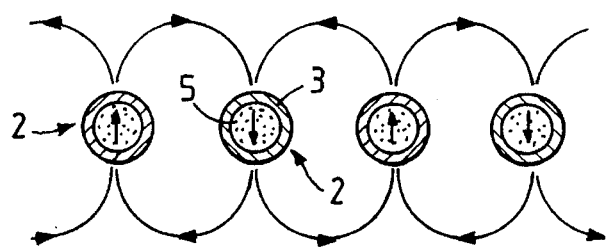
FIGS. 5 to 7 are diagrams showing different ways in which excitation devices of the invention can be organized in a multipolar structure.
Figure 6:
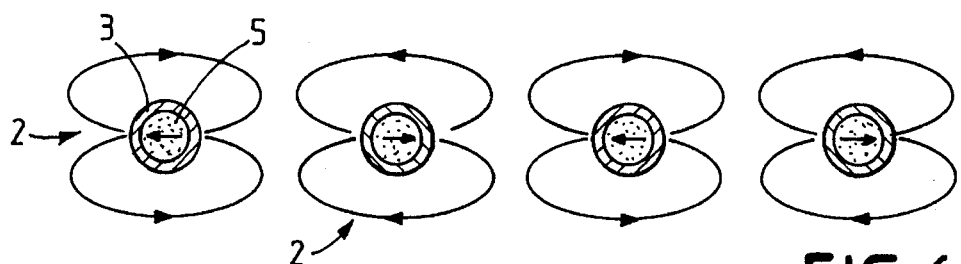
Figure 7:
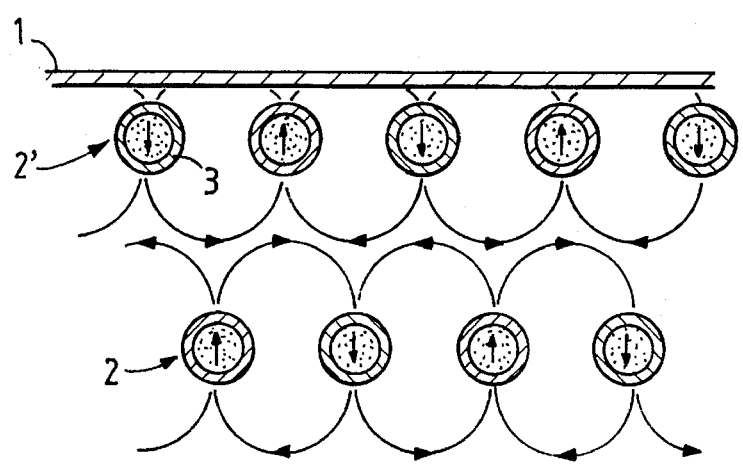

The multipolar structures shown in FIGS. 5 and 6 enable a plasma to be produced on either side of the plane containing the applicators. In various applications, provision may be made to use a second series of excitation devices 2' of the invention in order to confine the plasma. As shown in FIG. 7, the excitation devices 2' belonging to said second series comprise wire applicators 3 that are not fed with microwave energy. Such a structure serves to confine the plasma on one side only of the excitation devices 2, namely the side that does not include the confinement devices. Naturally, the applicators 2' may be mounted inside or outside the wall of the enclosure 1.

In general, other multipolar structures can be devised without going beyond the ambit of the invention and implementing wire applicators that are not fed with microwave energy and that do not include means for creating a static magnetic field. Such applicators which may be connected to ground, for example, serve to improve propagation and confinement of microwaves in thee proximity of applicators of the magnetic and electric field. It should be observed that such applicators or tubes may also serve for delivering gas, photons, additional electrons, radiation, etc.

The invention thus makes it possible to remedy problems of dissociated application of the microwave electric field and of the static electric field. According to the invention, the wire applicator is self-contained, thereby providing flexibility in use, in particular in the choice of configurations for the reaction enclosure and for the field of application.

Another advantage is the efficiency of the device since the microwave electric field and the static magnetic field are localized along the wire applicator and are both at a maximum at the surface of the applicator. Integrating the applicator with means for creating the magnetic field in order to form a single element also makes it possible to achieve greater simplicity in implementation, including on existing reactors enclosures. Finally, the possibility of using such applicators as a virtual plasma wall makes it possible to achieve considerable reduction in contamination due to interactions between the plasma and a physical wall.

The invention is not limited to the examples described and shown, since various modifications can be applied thereto without going beyond the ambit of the invention.

We claim:

1. A plasma excitation device of the type comprising:

at least one electrically conductive wire applicator fed by a source of energy in the microwave range; and means for creating a magnetic field and adapted to create at least one surface having a constant magnetic field of a flux density that corresponds to electron cyclotron resonance, said surface extending over at least a fraction of the length of the applicator;

wherein the wire applicator includes the means for creating the magnetic field, with the main component thereof being situated in a cross-section of the applicator and extending along at least a fraction of the length of the applicator, the applicator thus constituting an applicator both of a microwave electric field and of a static magnetic field.

2. A device according to claim 1, wherein the wire applicator carries a direct electrical current which constitutes the means for creating the magnetic field.

3. A device according to claim 1, wherein the wire applicator includes at least one permanent magnet that constitutes the means for creating the magnetic field.

4. A device according to claim 3, wherein the means for creating the magnetic field are constituted by at least one permanent magnet mounted inside the applicator which is constituted by a tube.

5. A device according to claim 2, wherein the applicator is surrounded by a dielectric envelope.

6. A device according to claim 1, wherein the applicator includes at least one pipe for conveying a flow of cooling fluid.

7. A device according to claim 6, wherein the pipe for conveying a flow of cooling fluid is formed inside the permanent magnet and/or between the permanent magnet and the applicator-forming tube.

8. A plasma-producing structure comprising a sealed enclosure connected to a pumping circuit and to a circuit for delivering a gaseous medium for maintaining a determined pressure inside the enclosure, the structure including a series of plasma excitation devices disposed side by side, said plasma excitation devices being of the type comprising:

at least one electrically conductive wire applicator fed by a source of energy in the microwave range; and means for creating a magnetic field and adapted to create at least one surface having a constant magnetic field of a flux density that corresponds to electron cyclotron resonance, said surface extending over at least a fraction of the length of the applicator, wherein the wire applicator includes the means for creating the magnetic field, with the main component thereof being situated in a cross-section of the applicator and extending along at least a fraction of the length of the applicator, the applicator thus constituting an applicator both of a microwave electric field and of a static magnetic field.

9. A structure according to claim 8, wherein some of the applicators of the devices are fed with energy in the microwave range.

10. A structure according to claim 8, wherein some of the applicators of the devices are not fitted with means for creating a magnetic field.

11. A structure according to claim 8, wherein some of the applicators of the deices are not fed with microwave energy and are not provided with means for creating a static magnetic field.

12. A plasma-producing structure comprising a sealed enclosure connected to a pumping circuit and to a circuit for delivering a gaseous medium for maintaining a determined pressure inside the enclosure, the structure including at least plasma confining means formed by a series of plasma excitation devices disposed side by side and in which the applicators are not fed with energy in the microwave range, said plasma excitation devices being of the type comprising:

at least one electrically conductive wire applicator fed by a source of energy in the microwave range; and means for creating a magnetic field and adapted to create at least one surface having a constant magnetic field of a flux density that corresponds to electron cyclotron resonance, said surface extending over at least a fraction of the length of the applicator, wherein the wire applicator includes the means for creating the magnetic field, with the main component thereof being situated in a cross-section of the applicator and extending along at least a fraction of the length of the applicator, the applicator thus constituting an applicator both of a microwave electric field and of a static magnetic field.

* * * * *